United States Patent [19]

Pianka

[11] Patent Number: 5,345,357

[45] Date of Patent: Sep. 6, 1994

[54] ESD PROTECTION OF OUTPUT BUFFERS

[75] Inventor: Juergen Pianka, Bethlehem, Pa.

[73] Assignee: AT&T Bell Laboratories, Murray Hill, N.J.

[21] Appl. No.: 894,405

[22] Filed: Jun. 5, 1992

[51] Int. Cl.$^5$ ............................................. H02H 9/04
[52] U.S. Cl. ...................................... 361/56; 361/91; 361/111; 361/118
[58] Field of Search ..................... 361/56, 111, 91, 118

[56] References Cited

U.S. PATENT DOCUMENTS 4,990,802  2/1991  Smooha ............................. 307/482
5,208,719  5/1993  Wei ...................................... 361/56

OTHER PUBLICATIONS

"Dynamic Gate Coupling of NMOS for Efficient Output ESD Protection", by Charvaka Duvvury and Carlos Diaz, Texas Instruments Inc., Semiconductor Process Design Center, pp. 141 through 150, 30th Annual Proceedings, Reliability Physics 1992, San Diego, CA., Mar. 31, Apr. 1, 2, 1992.
IEEE Catalog No. 92CH3084-1, Sponsored by the IEEE Electron Devices Society and the IEEE Reliability Society, Copy 1992 by the Institute of Electrical and Electronics Engineers, Inc., 345 E. 47th St., New York, NY 10017.

Primary Examiner—A. D. Pellinen
Assistant Examiner—Stephen W. Jackson
Attorney, Agent, or Firm—James H. Fox

[57] ABSTRACT

A particular electrostatic discharge (ESD) protection problem is faced when only n-channel output transistors are present, since there is no p-n junction that could serve to clamp positive ESD voltages, as would be the case if a p-channel output transistor were present. In the present technique, a capacitor couples a bond pad to the gate of a protective transistor that applies a turn-on voltage to the gate of an n-channel output transistor. In this manner, the output transistor itself is used to conduct the ESD current to a power supply conductor ($V_{SS}$). In one embodiment, to assist in the turn-on of the n-channel output transistor, a transistor couples the bond pad to the n-tub in which the p-channel pre-driver transistor is formed. Conduction through this transistor raises the n-tub voltage when an ESD event occurs, thereby preventing the p-n junction of the p-channel driver transistor from clamping the turn-on voltage, which would limit the protection obtained by this technique. This technique is especially valuable for SCSI (Small Computer System Interface) chips, since only n-channel output transistors are used. It may also be used in TTL-output buffers, which also use n-channel pull-up and pull-down devices. P-channel output devices may be comparably protected.

17 Claims, 2 Drawing Sheets

ESD PROTECTION OF OUTPUT BUFFERS

BACKGROUND OF THE INVENTION

1. Field of the Invention

The present invention relates to an integrated circuit having protection from electrostatic discharge (ESD).

2. Description of the Prior Art

The protection of integrated circuits from electrostatic discharge has been a significant design issue, especially as transistor electrode dimensions shrink below the 1.5 micron level. An excessively high ESD voltage conducted from a package terminal to the integrated circuit bondpad can easily damage input or output circuitry, unless protection techniques are adopted. It appears that the use of the lightly-doped drain (LDD) structure and silicided source/drain regions has increased ESD susceptibility, especially in output buffers that utilize n-channel field effect transistors. One recent study by C. Duvvury and C. Diaz, "Dynamic Gate Coupling of NMOS for Efficient Output ESD Protection" Proceedings of the IRPS (1992), indicates that improved ESD performance can be obtained using a field oxide capacitor to couple the gate of the output transistor to the bondpad; see FIG. 6 therein. In that technique, the output transistor is made to carry the ESD current. However, the field oxide capacitor undesirably increases the capacitive load on the bondpad, requiring a larger output transistor.

A somewhat similar prior-art technique is shown in FIG. 1, wherein an output buffer 10 is connected to the bondpad 11. A protective n-channel transistor 13 is connected to the bondpad for conducting ESD current (I) to the power supply conductor ($V_{SS}$). The ESD voltage is conducted to the gate of transistor 13 by capacitor 12, typically about 10 picofarads in one design. This conduction tends to allow transistor 13 to conduct by means of bipolar break-down action during an ESD event, allowing the current I to flow. The resistor 14, typically about 2 kilohms, causes the positive charge on the gate of transistor 13 to be conducted to $V_{SS}$, thereby turning transistor 13 off after the ESD event has dissipated. In this manner, transistor 13 does not conduct during normal operation of the output buffer. However, the circuitry of FIG. 1 requires that the protective transistor be sufficiently large so as to be able to carry the relatively large ESD current. This requirement increases the area required to implement the output buffer. In addition, the transistor 13 presents an additional capacitive load to the buffer 10, which again undesirably requires that the buffer have additional drive capability, and hence increased size.

In some cases, protection against positive ESD voltages is improved by the presence of a p-channel output transistor. In that case, the p-n junction of the drain electrode, which is connected to the bondpad, provides for clamping positive ESD voltages to a power supply conductor. However, some designs use only n-channel output transistors. For example, TTL output buffers typically use n-channel transistors for both the pull-up and pull-down devices. More recently, the Small Computer Systems Interface (SCSI) chips have output buffers that typically use only n-channel transistors. It is therefore desirable to have an improved ESD protection technique that is effective with output buffers, and which mitigates certain problems associated with the prior-art techniques.

SUMMARY OF THE INVENTION

I have invented a technique for protecting output transistors, wherein an additional device coupled to the bondpad causes an output transistor to conduct during an ESD event. In an illustrative case, an n-channel output transistor has its gate coupled to the output bondpad through an additional transistor having its gate coupled to the bondpad by means of a capacitor. This arrangement allows the output transistor to turn on during an ESD event, thereby conducting the ESD current to a power supply conductor. Both pull-up and pull-down output transistors may be protected in this manner. In one embodiment of the invention, the doped semiconductor region (e.g., n-tub) in which a pre-driver transistor (e.g., p-channel) is formed is also coupled to the bondpad so as to be raised in voltage when an ESD event occurs.

DETAILED DESCRIPTION

The present detailed description relates to an improved integrated circuit electrostatic discharge protection technique. It may advantageously be used with output buffers having pull-up and pull-down transistors of a single conductivity type. In the illustrative case, n-channel output devices are shown. A comparable protective circuit for use with p-channel output devices is the same as that shown, except that p-channel transistors are used in lieu of n-channel transistors, and the power supply connections are the opposite of those shown.

Figure 2:
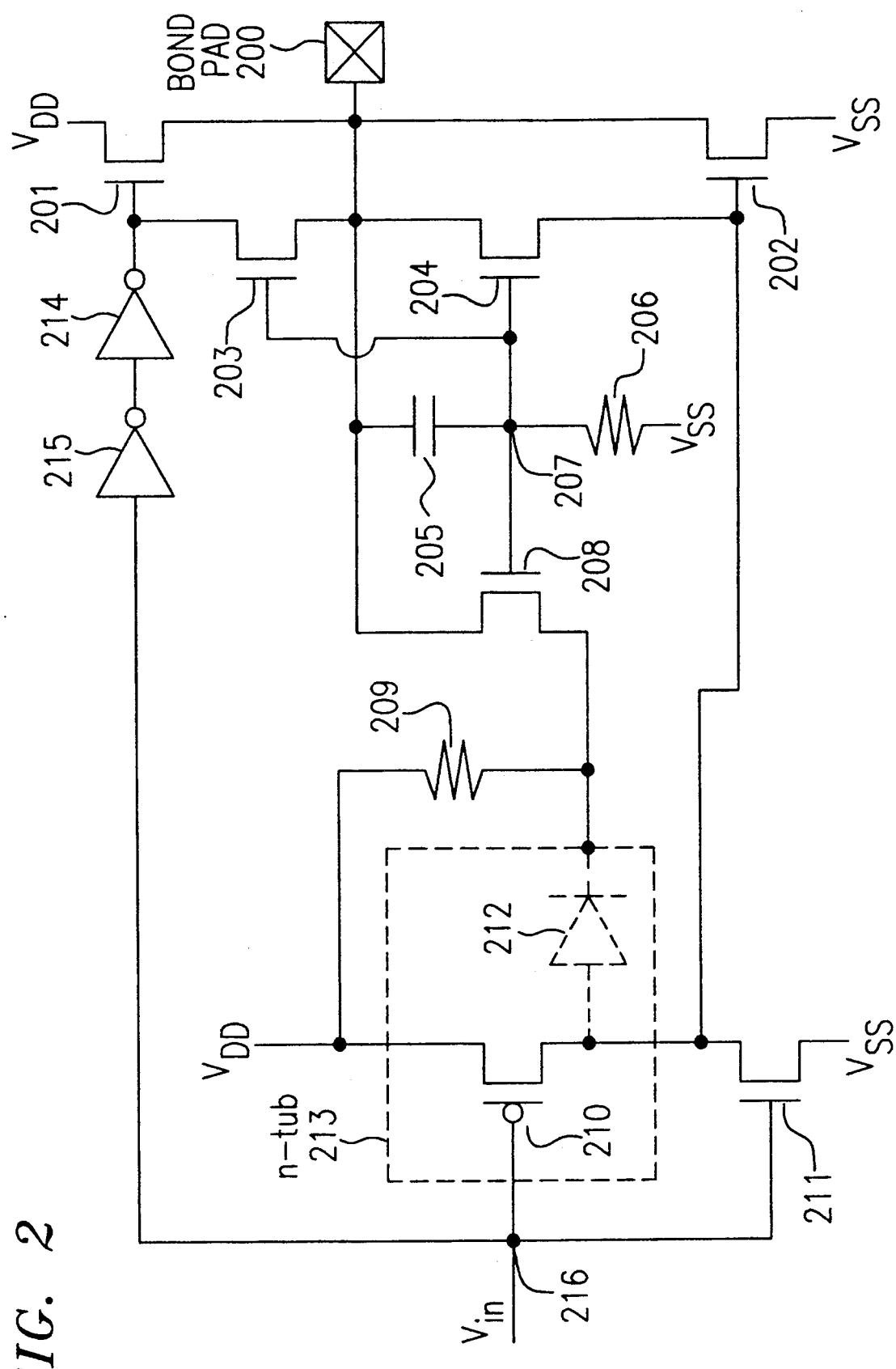
FIG. 2 shows an illustrative embodiment of the present invention.

Referring to the illustrative embodiment of FIG. 2, an output conductor (bond pad 200) is connected to n-channel pull-up transistor 201 and n-channel pull-down transistor 202. In a first aspect of the invention, the gates of transistors 201 and 202 are connected to protective transistors 203 and 204, which are also connected to bond pad 200 as shown. Furthermore, the gates of protective transistors 203 and 204 are connected to capacitor 205 and resistor 206 at common node 207. During a positive-voltage ESD event, the high voltage is conducted through capacitor 205 to the gates of transistors 203 and 204. This conduction increases the voltage on the gates of these transistors to approximately the same voltage as on their sources/drain regions also connected to bond pad 200. This reduces the breakdown voltage across transistors 203 and 204, allowing them to conduct by means of bipolar action at a relatively low voltage. (As is well known in the art, each MOS transistor may be considered to have a bipolar transistor connected in parallel, comprising emitter, base, and collector regions corresponding to the source, channel, and drain regions of the MOS device.) This conduction through protective transistors 203 and 204 also raises the voltage on the gates of output transistors 201 and 202, respectively. This conduction also lowers the breakdown thresholds of these output transistors, allowing bipolar conduction through these transistors to conduct the ESD current to their respective power supply conductors, $V_{DD}$ and $V_{SS}$.

After a certain period of time following the onset of an ESD event, conduction of current through resistor 206 to the $V_{SS}$ conductor lowers the voltage on node 207, and hence on the gates of protective transistors 203 and 204. The lower gate voltage raises the breakdown threshold of these transistors, and turns them off at some point. Therefore, the gates of output transistors 201 and 202 are no longer placed at a high voltage, and these transistors also cease to conduct by means of bipolar breakdown action at some point. However, in normal circuit operation, the node 207 is held low through resistor 206, and so conduction through the protective transistors 203 and 204 does not occur. Therefore, normal circuit operation is not impaired. I recommend that capacitor 205 have a value in the range of from 0.2 to 50 picofarads, and resistor 206 have a value in the range of from 200 ohms to 50 kilohms. Further, I recommend that the RC time constant provided by these devices be preferably in the range of from 1 to 50 nanoseconds. In an illustrative embodiment, capacitor 205 has a nominal value of 3.3 picofarads, whereas resistor 206 has a nominal value of 3 kilohms. These values provide a nominal RC time constant of about 10 nanoseconds.

I recommend that the circuitry be designed so that conduction of the output transistors is obtained only for an ESD event that produces a voltage on the bond pad that rises more rapidly than 100 volts per nanosecond. In that manner, normal information signals do not cause conduction via the protective circuitry. The capacitor 205 is illustratively of the MOS type, wherein a conductive polysilicon layer forms a first capacitor plate, and a doped semiconductor substrate (or tub) region forms the second capacitor plate, with a gate-level silicon dioxide layer forming the capacitor dielectric. Alternatively, the capacitor may comprise two polysilicon layers for the plates, with a deposited dielectric therebetween. Still other capacitor types are known in the art and may be used. Illustratively, resistor 206 is formed in an n-tub in a manner comparable to resistor 209 discussed below. However, it may alternatively be formed in a p-tub, or may be a deposited resistor of the polysilicon or silicide type, or may be of another type known in the art.

In the exemplary embodiment of the inventive technique, means are also provided for boosting the voltage on the n-tub region in which the p-channel pre-driver transistor is formed during an ESD event. This boosting prevents conduction from the drain of the p-channel pre-driver to the underlying n-tub from limiting the voltage on the gate of the associated output transistor during an ESD event. That is, as shown in FIG. 2, the p-type drain of the pre-driver transistor 210 forms a diode 212 with the underlying n-type tub region 213 in which the drain is formed. In prior-art CMOS integrated circuit designs, the tub 213 would be connected directly to the $V_{DD}$ conductor. Therefore, conduction through the diode 212 would limit the positive voltage on the gate of output transistor 202 to no more than one junction voltage drop above the voltage on the $V_{DD}$ conductor during an ESD event. This clamping effect of diode 212 would therefore place an undesirable limitation on the effectiveness of the above-described action of protective transistor 204. Therefore, in the illustrative embodiment of the invention, a transistor 208 is connected between the bond pad 200 and the n-tub 213. This transistor 208 also exhibits bipolar breakdown when an ESD event occurs, thereby conducting charge to the n-tub 213 and raising its voltage.

Figure 3:
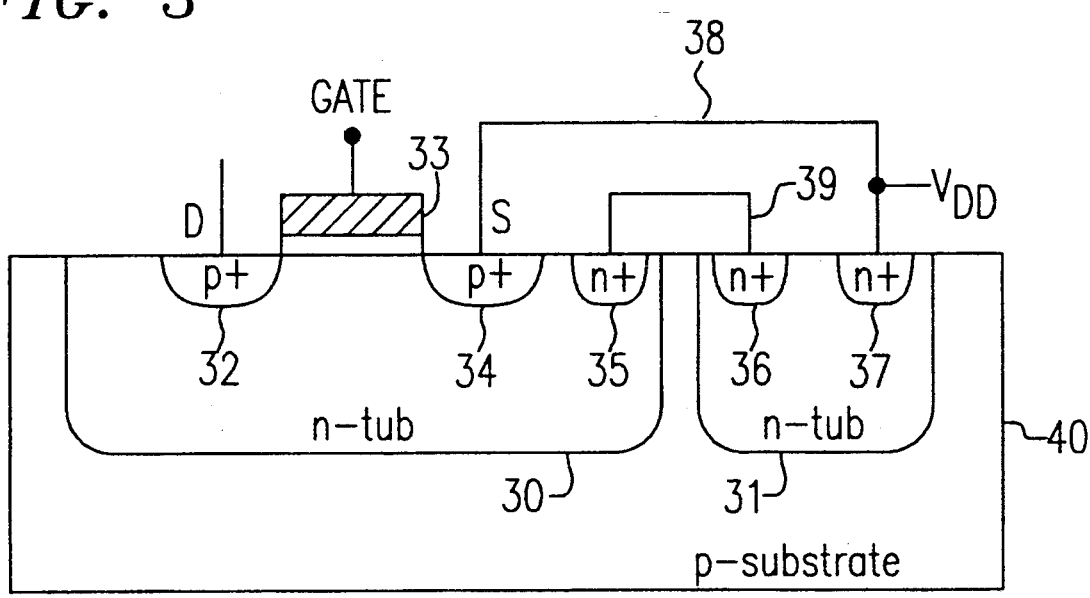
FIG. 3 shows an illustrative resistor used in one embodiment of the invention.

To allow the voltage on the n-tub 213 to rise, the n-tub is not connected directly to the $V_{DD}$ conductor, but rather through resistor 209. This resistor limits the conduction through diode 212 to the $V_{DD}$ conductor, and hence allows the voltage on the gate of output transistor 202 to rise to a higher level during an ESD event. The resistor 209 has a value of about 600 ohms in the exemplary embodiment, and is typically in the range of about 50 to 5000 ohms. The resistor may be a deposited (e.g., polysilicon) resistor, or a diffused region in the semiconductor substrate, or other type. For example, as shown in FIG. 3, an n-tub 31 may be used to form the resistor 209, which is connected to $V_{DD}$ via n+ contact region 37. The resistor is connected via n+contact region 36, conductor 39, and n+ contact region 35 to the n-tub 30, corresponding to region 213 in FIG. 2. The p-channel pre-driver transistor (210 of FIG. 2), comprising source/drain regions 32 and 34, and gate electrode 33, is formed in n-tub 30. The p-channel transistor in the pre-driver complementary inverter 214 may be located in an n-tub similarly connected to $V_{DD}$, or alternatively in the same n-tub as transistor 210.

Note however that the use of tub-boosting transistor 208 and resistor 209, although advantageous in the illustrative embodiment, are not necessary in all cases. That is, the pre-driver stage that produces the logic signal to the output transistor may be of a different design than that shown, and the diode 212 may not be present. For example, the pre-driver pull-up device may be an n-channel transistor, rather than a p-channel transistor; hence the source-to-substrate diode would be connected opposite to diode 212 shown, and would not cause clamping of positive voltages.

Figure 1:
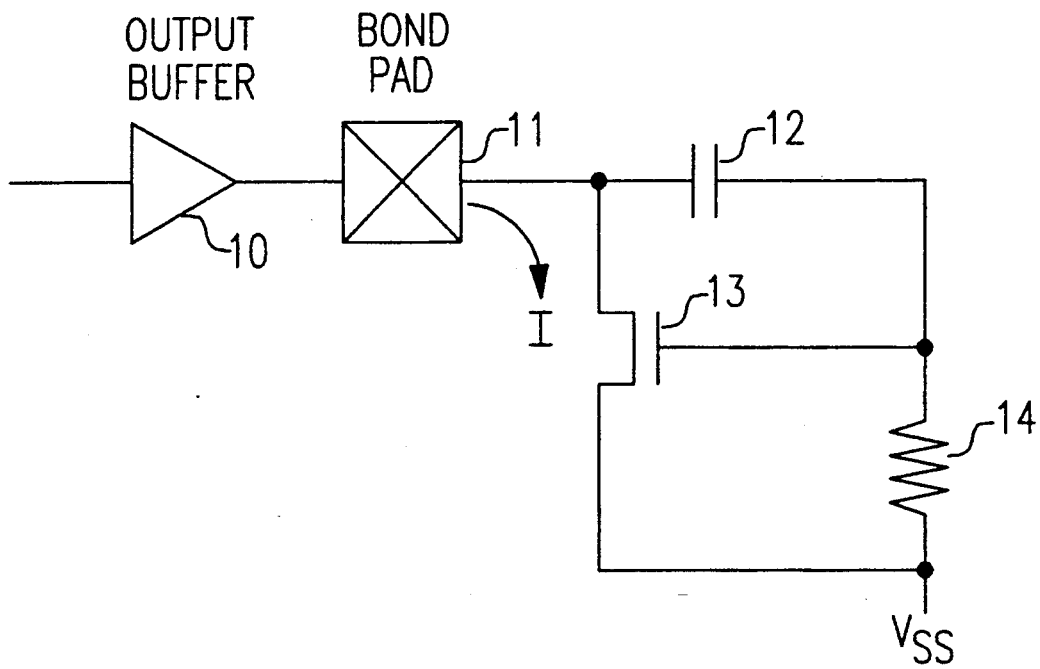
FIG. 1 shows a prior-art output protection technique.

Note that in contrast to the prior-art technique of FIG. 1, the protective transistors 203 and 204 do not carry the actual ESD current themselves. Hence, the transistors 203 and 204 may be sized to be relatively small, which saves space as compared to certain prior-art techniques. In the present technique, it is the output transistors 201 and 202 that carry the ESD current to one or both of the power supply conductors $V_{SS}$ and $V_{DD}$. However, the output transistors are usually relatively large anyway, in order to provide sufficient drive capability. Hence, no size increase may be required to provide ESD protection in typical implementations of the present technique. Furthermore, since the protective transistors 203 and 204 are relatively small, they add minimal capacitive loading to the output circuitry, as compared to the prior-art technique.

The above embodiment has shown a transistor (e.g., 203 and 204) and an RC network (capacitor 205 and resistor 206) as the protective means that causes the output transistors (201 and 202) to conduct during an ESD event in response to the high voltage on bond pad 200. However, other device types may be used for implementing the protective means. For example, a thyristor may serve to couple the bond pad to the gate of an output transistor, causing the output transistor to conduct when the voltage on the bond pad exceeds a desired limit. In that case, a capacitor (205) may not be present to couple the control electrode of the thyristor to the bond pad. Furthermore, the pull-down resistor (206) may not need to be present. Still other types of devices to cause conduction of the output transistors during an ESD event are possible. Note that when the ESD voltage has ceased, the protective means no longer causes the output transistor to conduct, and they are returned to control by the logic signal from the pre-driver circuitry. Normally, ESD events occur when the integrated circuit is not connected in a circuit board or multi-chip module, and hence the logic signals are not present anyway. Conversely, when connected in a circuit board or module, the normal operating logic signals may be present, but the ESD events are less likely to occur. Although digital logic circuitry has been discussed herein, the protected circuitry may be analog. Therefore, the desired operational signal ($V_{in}$) may be generally referred to as an "information signal".

As discussed above, the present technique may be used with an output buffer having only a single conductivity type of output transistor. However, it may alternatively be used with CMOS output buffers as well, wherein a p-channel transistor serves as the pull-up device and an n-channel transistor serves as the pull-down device. In that case, the n-channel pull-down device may still be protected by the circuitry shown in FIG. 2. If desired, the p-channel device may be protected with comparable circuitry, but with the transistor conductivities opposite to that shown, and also opposite power supply connections. In that case, a resistor comparable to 209 could then be connected between the p-tub in which the n-channel pre-driver transistor is formed and the $V_{SS}$ power supply conductor. Although MOS type transistors have been shown in the illustrative embodiment, the present invention may alternatively be implemented with bipolar devices, or with mixed device types, as in BICMOS technology. Other ESD protective techniques may also be used with an output buffer protected by the inventive technique. For example, the connection between the source/drain electrodes of the output transistors and the output conductor (e.g., bond pad) may include a resistor, as shown for example in U.S. Pat. No. 4,990,802 coassigned herewith. Still other variations will be apparent to persons of skill in the art.

I claim:

1. An integrated circuit comprising an output transistor having: a first controlled electrode coupled to a power supply conductor, a second controlled electrode coupled to an output conductor, and a control electrode coupled to receive an information signal;

characterized in that said integrated circuit further comprises a protective device having: a first controlled electrode coupled to said output conductor, a second controlled electrode coupled to the control electrode of said output transistor, and a control electrode coupled to said output conductor so as to cause said output transistor to conduct during an electrostatic discharge;

wherein said protective device is a field effect transistor, and further comprising a capacitor connected between said output conductor and the gate of said protective transistor; and still further comprising a resistor connected between the gate of said protective transistor and a power supply conductor, so that said protective transistor does not conduct in the absence of an electrostatic discharge event.

2. The integrated circuit of claim 1 wherein said output transistor is an n-channel field effect transistor, and said information signal is supplied by a pre-driver stage that includes a p-channel pull-up transistor that is located in an n-type tub region;

and wherein said integrated circuit further comprises means for increasing the voltage on said n-type tub region during an electrostatic discharge event.

3. The integrated circuit of claim 2 wherein said means for increasing the voltage on said n-type tub region comprises a transistor having a first source/drain region connected to said output conductor, and a second source/drain region connected to said tub.

4. The integrated circuit of claim 2 wherein said means for increasing the voltage on said n-type tub region comprises a resistor connected between said n-type tub and the positive power supply voltage conductor.

5. The integrated circuit of claim 2 wherein said protective device provides for said output transistor to conduct when the electrostatic discharge event produces a voltage on said output conductor that rises more rapidly than 100 volts per nanosecond.

6. An integrated circuit comprising an output transistor having a first source/drain region of a given conductivity type coupled to a power supply conductor and a second source/drain region of said given conductivity type coupled to an output conductor, and a gate coupled to a pre-driver circuit, characterized in that said integrated circuit further comprises: a protective transistor having a first source/drain region of said given conductivity type coupled to the gate of said output transistor, a second source/drain region of said given conductivity type coupled to said output conductor, and a gate coupled to said output conductor through a capacitor; and still further comprises a resistor coupled between the gate of said protective transistor and a power supply conductor so that said protective transistor does not conduct in the absence of an electrostatic discharge event.

7. The integrated circuit of claim 6 wherein said output transistor is an n-channel field effect transistor, and said pre-driver circuit includes a p-channel pull-up transistor that is located in an n-type region;

and wherein said integrated circuit further comprises means for increasing the voltage on said n-type tub region during an electrostatic discharge event.

8. The integrated circuit of claim 7 wherein said means for increasing the voltage on said n-type tub region comprises a transistor having a first source/drain region connected to said output conductor, and a second source/drain region connected to said tub, and a gate connected to the gate of said protective transistor.

9. The integrated circuit of claim 7 wherein said means for increasing the voltage on said n-type tub region comprises a resistor connected between said n-type tub and the positive power supply voltage conductor.

10. The integrated circuit of claim 6 wherein said given conductivity type is n-type.

11. The integrated circuit of claim 6 wherein said protective transistor provides for said output transistor to conductor when the electrostatic discharge event produces a voltage on said output conductor that rises more rapidly than 100 volts per nanosecond.

12. An integrated circuit comprising:

a field effect pull-up transistor of a given conductivity type having a source coupled to a positive power supply conductor, a drain coupled to an output conductor, and a gate coupled to receive an information signal;

and a field effect pull-down transistor of said given conductivity type having a source coupled to a negative power supply conductor, a drain coupled to said output conductor, and a gate coupled to receive said information signal;

characterized in that said integrated circuit further comprises first and second field effect protective transistors, both of said given conductivity type;

wherein the first protective transistor has a first source/drain electrode coupled to the gate of said pull-up transistor, a second source/drain electrode coupled to said output conductor, and a gate electrode; and wherein the second protective transistor has a first source/drain electrode coupled to the gate of said pull-down transistor, a second source/drain electrode coupled to said output conductor, and a gate electrode;

and still further comprises means for coupling the gate electrodes of said first and second protective transistors to said output conductor so as to cause said pull-up and pull-down transistors to conduct during an electrostatic discharge event.

13. The integrated circuit of claim 12 wherein said means for coupling the gate electrodes of said protective transistors to said output conductor comprises a capacitor connected between said gate electrodes and said output conductor; and wherein said integrated circuit further comprises a resistor connected from the gate electrodes of said protective transistors to a power supply conductor so that said protective transistors do not conduct in the absence of an electrostatic discharge event.

14. The integrated circuit of claim 12 wherein said given conductivity type is n-type.

15. The integrated circuit of claim 14 wherein said information signal is supplied by a pre-driver stage that includes a p-channel pull-up transistor that is located in an n-type tub region;

and wherein said integrated circuit further comprises means for increasing the voltage on said n-type tub region during an electrostatic discharge event.

16. The integrated circuit of claim 15 wherein said means for increasing the voltage on said n-type tub region comprises a transistor having a first n-type source/drain region connected to said output conductor, and a second n-type source/drain region connected to said tub region.

17. The integrated circuit of claim 16 wherein said means for increasing the voltage on said n-type region comprising a resistor connected between said n-type tub region and the positive power supply voltage conductor.

* * * * *